US 6,594,070 B2

(12) United States Patent
Sugata et al.

(10) Patent No.: US 6,594,070 B2
(45) Date of Patent: Jul. 15, 2003

(54) OPTICAL COMMUNICATION SYSTEM, OPTICAL RECEIVER AND WAVELENGTH CONVERTER

(75) Inventors: Akihiko Sugata, Kawasaki (JP); Tetsuya Kiyonaga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/062,464

(22) Filed: Feb. 5, 2002

(65) Prior Publication Data

US 2002/0089737 A1 Jul. 11, 2002

Related U.S. Application Data

(63) Continuation of application No. PCT/JP99/04494, filed on Aug. 20, 1999.

(51) Int. Cl.[7] .................... G02F 2/02; H04B 10/04; H04B 10/06
(52) U.S. Cl. .............. 359/326; 359/154; 359/180; 359/189
(58) Field of Search ................... 359/326–332, 359/154, 180, 189

(56) References Cited

U.S. PATENT DOCUMENTS 5,610,911 A * 3/1997 Ishikawa et al. ............ 370/503

FOREIGN PATENT DOCUMENTS

| JP | 62-42633 | 2/1987 | |
| JP | 4-16038 | 1/1992 | |
| JP | 5-130088 | * 5/1993 | ............. H04L/5/16 |
| JP | 8-149000 | 6/1996 | |
| JP | 10-150417 | 6/1998 | |
| JP | 10-313277 | 11/1998 | |
| JP | 11-275030 | 10/1999 | |

* cited by examiner

Primary Examiner—John D. Lee
(74) Attorney, Agent, or Firm—Staas & Halsey LLP

(57) ABSTRACT

An optical communication system transmits an optical signal from an optical sender to an optical receiver. A superimposed signal corresponding to a transmission speed of the optical signal is superimposed on the optical signal. At the optical receiver which receives the transmission light, the transmission speed is detected based on the superimposed signal included in the received light, and setting of a phase-lock loop circuit for extracting a clock signal is switched, to thereby perform a data decision processing of the received light. Thus, it becomes possible to receive and process optical signals at different transmission speeds by a single optical receiver, even when optical signals at the different transmission speeds are transmitted between the optical sender and the optical receiver.

14 Claims, 5 Drawing Sheets

OPTICAL COMMUNICATION SYSTEM, OPTICAL RECEIVER AND WAVELENGTH CONVERTER

CROSS-REFERENCE TO RELATED APPLICATIONS

This application is a continuation of PCT/JP99/04494, filed on Aug. 20, 1999.

BACKGROUND OF THE INVENTION

1. Field of the Invention

The present invention relates to an optical communication system, optical receiver and wavelength converter, capable of processing optical signals at different transmission speeds.

2. Description of the Related Art

In recent arterial optical communication systems, for example, there have been developed various optical modulators and electronic circuits adaptable to high transmission speeds in the systems aiming at long transmission distances and increased transmission capacities. However, if a transmission speed reaches a range of 10 Gb/s or higher, it becomes extremely difficult to realize electronic circuits and the like which operate at higher speeds. Therefore, there has been actively made research and development of systems for aiming at increased capacities such as by wavelength division multiplexing techniques. Under these circumstances, a large number of components such as optical senders and optical receivers have become installed onto optical communications apparatus, and also there has been proposed such a system to transmit optical signals at different transmission speeds through a single optical fiber.

There will be briefly explained hereinafter conventional optical receivers.

In a typical optical receiver, an optical signal transmitted via an optical transmission path is optical-electric converted by a light receiving element into an electrical data signal. The thus converted data signal is branched into two branched signals, one branched data signal being equalized and amplified, to be input to a decision circuit; and the other branched data signal being sent to a clock extracting section that obtains deciding timing. The clock extracting section is typically constituted of: an EXOR circuit or a combination of differential circuit and full-wave rectifying circuit; and a filter such as an SAW filter or a dielectric filter, so as to send a extracted clock signal to the above described decision circuit. Then, the one branched data signal is decided at the decision circuit in accordance with timing of the extracted clock signal.

As the clock extracting section mentioned above, there is frequently used a phase-lock loop (PLL). In this case, the one branched data signal branched in the same manner as the above is input to the decision circuit, and the other branched data signal is input to a phase comparator that compares a phase of the other branched data signal with a phase of an output of a voltage controlled oscillator (VCO) constituting the PLL circuit. Then, due to a loop constitution in which an output of the phase comparator is used as a controlling signal of the VCO, the synchronization of the VCO with the other branched data signal is made, so that the output of the VCO is output as the clock signal.

However, the above described conventional optical receiver has such a defect that the optical receiver can receive only an optical signal at a single transmission speed, because the frequency of clock signal capable to be extracted is fixed due to constraints such as a band of the filter and a controlling range of the VCO, to be used in the clock extracting section. Further, there may be caused constraints on the transmission speed of the receivable optical signal, also due to the band of the equalization and amplification to be performed at the data deciding side. Accordingly, in the above described case where optical signals at different transmission speeds are to be transmitted through a single optical fiber, it is required to provide a dedicated optical receiver for each transmission speed, thereby complicating the constitution of the optical communication system.

SUMMARY OF THE INVENTION

The present invention has been carried out in view of the above, and it is therefore an object of the present invention to provide an optical communication system and an optical receiver with a simplified constitution, capable of receiving and processing optical signals at different transmission speeds. It is a further object of the present invention to provide a wavelength converter adaptable to a plurality of transmission speeds, by mutually combining the optical receiver and optical.sender according to the present invention.

Note, the present applicant has proposed an optical receiver for receiving and processing optical signals at different transmission speeds within a single apparatus, in the prior patent application (see Japanese Patent Application No. 10-69694). However, the present invention differs from the invention of the prior patent application, in terms of detecting system of transmission speeds of received optical signals.

To this end, the present invention provides an optical communication system including an optical sender that transmits optical signals at different transmission speeds and an optical receiver that receives a transmission light from the optical sender to thereby perform a data decision processing, wherein the optical sender comprises superimposed signal generating means for generating a superimposed signal corresponding to a transmission speed of transmission light, to place the superimposed signal onto the transmission light, and the optical receiver comprises speed detecting means for detecting the transmission speed based on the superimposed signal included in a received light, and data processing means for performing a data decision processing of the received light according to the transmission speed detected by the speed detecting means.

In the optical communication system having such a constitution, the transmission light output from the optical sender includes the superimposed signal corresponding to the transmission speed thereof, while the transmission speed is detected at the optical receiver having received the transmission light, based on the superimposed signal included in the received light, so that the data decision processing is performed corresponding to the transmission speed of the received light. Thus, it becomes possible to receive and process optical signals at different transmission speeds by a single optical receiver, even when optical signals at different transmission speeds are transmitted between the optical sender and optical receiver, thereby enabling to provide an optical communication system of a simplified constitution.

The present invention further provides an optical receiver that receives optical signals at different transmission speeds to perform a data decision processing, wherein the optical receiver comprises speed detecting means for detecting a transmission speed of a received light, based on a superimposed signal which corresponds to the transmission speed and is included in the received light, and data processing means for performing a data decision processing of the received light, according to the transmission speed detected by the speed detecting means.

In the optical receiver having such a constitution, the transmission speed of the received light is detected based on the superimposed signal included in the received light, to thereby execute the data decision processing corresponding to the transmission speed of the received light. Thus, it becomes possible to process optical signals at different transmission speeds by a single optical receiver.

In the aforementioned optical receiver, the data processing means may comprises an optic-electric converting section that converts the received light into an electrical signal, an equalizing section that linearly amplifies an output signal from the optic-electric converting section, a clock extracting section that extracts a clock signal based on the output signal from the optic-electric converting section, making use of a phase-lock loop circuit with an operation setting thereof being switched corresponding to the transmission speed detected by the speed detecting means, and a decision processing section that performs a data decision processing of an output signal from the equalizing section, making use of the clock signal extracted by the clock extracting section.

According to such a constitution, the operation setting of the phase-lock loop circuit of the clock extracting section is switched to a setting suitable for the transmission speed detected by the speed detecting means, so that a clock signal can be extracted reliably even when the transmission speed of the received light is changed, thereby enabling to precisely receive and process optical signals at different transmission speeds by performing the data decision processing making use of the extracted clock signal.

As a specific constitution of the clock extracting section, the phase-lock loop circuit of the clock extracting section may include a plurality of controlled type oscillators corresponding to a plurality of transmission speeds, respectively, and any one of the plurality of controlled type oscillators may be driven according to the transmission speed detected by the speed detecting means. Alternatively, the phase-lock loop of the clock extracting section may include a single controlled type oscillator and a frequency converter that converts the frequency of an oscillation signal to be output from the controlled type oscillator, and a conversion ratio of the frequency converter may be set according to the transmission speed detected by the speed detecting means.

Further, for the data processing means, the equalizing section may have a variable equalizing band, which is controlled according to the transmission speed detected by the speed detecting means.

According to such a constitution, the operation setting of the clock extracting section and the equalizing band of the equalizing section are controlled at optimum corresponding to the transmission speed of the received light, thereby enabling to precisely receive and process optical signals at different transmission speeds.

The present invention further provides a wavelength converter that converts an optical signal input thereto, into an optical signal at the frequency different from the frequency of the input optical signal, wherein the wavelength converter comprises speed detecting means for detecting a transmission speed of input light, based on a superimposed signal which corresponds to the transmission speed and is included in the input light, data processing means for performing a data decision processing of the input light, according to the transmission speed detected by the speed detecting means, output light generating means for generating an output light having a wavelength different from the wavelength of the input light and modulated in accordance with a data signal indicative of a processing result by the data processing means, and superimposed signal generating means for generating a superimposed signal corresponding to the transmission speed detected by the speed detecting means, to place the superimposed signal onto the output light.

The wavelength converter having such a constitution can be regarded as being provided by combining the optical sender to an output stage of the optical receiver that is used in the optical communication system, thereby enabling to realize a wavelength conversion even for input lights at different transmission speeds.

DETAILED DESCRIPTION OF THE PREFERRED EMBODIMENTS

There will be described hereinafter embodiments of the present invention with reference to the accompanying drawings.

Figure 1:
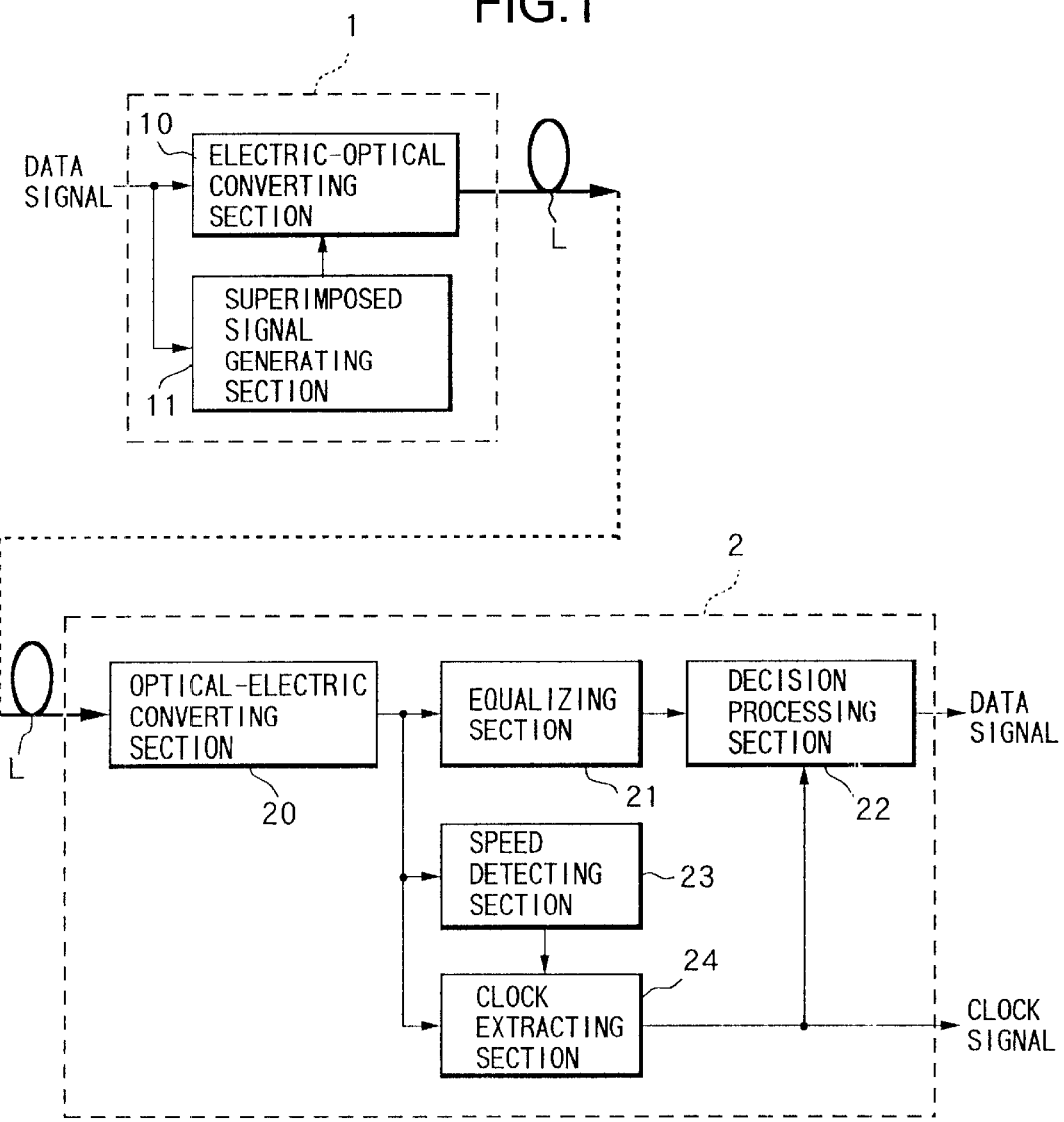
FIG. 1 is a block diagram showing a basic constitution in a first embodiment of an optical communication system according to the present invention.

FIG. 1 is a block diagram showing a basic constitution in a first embodiment of an optical communication system according to the present invention.

In FIG. 1, the present optical communication system is constituted to include an optical sender 1 capable of transmitting optical signals at different transmission speeds, and an optical receiver 2 for receiving and processing the optical signals sent from the optical sender 1 via an optical transmission path L. Although FIG. 1 shows the constitution in which the optical sender 1 and optical receiver 2 are connected by a single optical transmission path L, it is possible to adopt such a constitution in which a repeater such as for conducting optical amplification is disposed between the optical sender 1 and optical receiver 2.

The optical sender 1 includes an electric-optical converting section 10 and a superimposed signal generating section 11 as superimposed signal generating means. The electric-optical converting section 10 generates an optical signal which is modulated according to a data signal provided from the exterior and is superimposed with a signal output from the superimposed signal generating section 11, to send the optical signal to the optical transmission path L. It is assumed that the above data signal is an electrical signal representing transmittal information to be transmitted to the optical receiver 2 at a required transmission speed, and a transmission speed thereof is appropriately changed. The superimposed signal generating section 11 generates a superimposed signal corresponding to each of the changed transmission speeds of the data signal in a one-to-one manner. The optical signal carrying the superimposed signal is transmitted from the optical sender 1 to the optical receiver 2, so that speed information is also transmitted to the optical receiver 2 together with the transmittal information.

Figure 2:
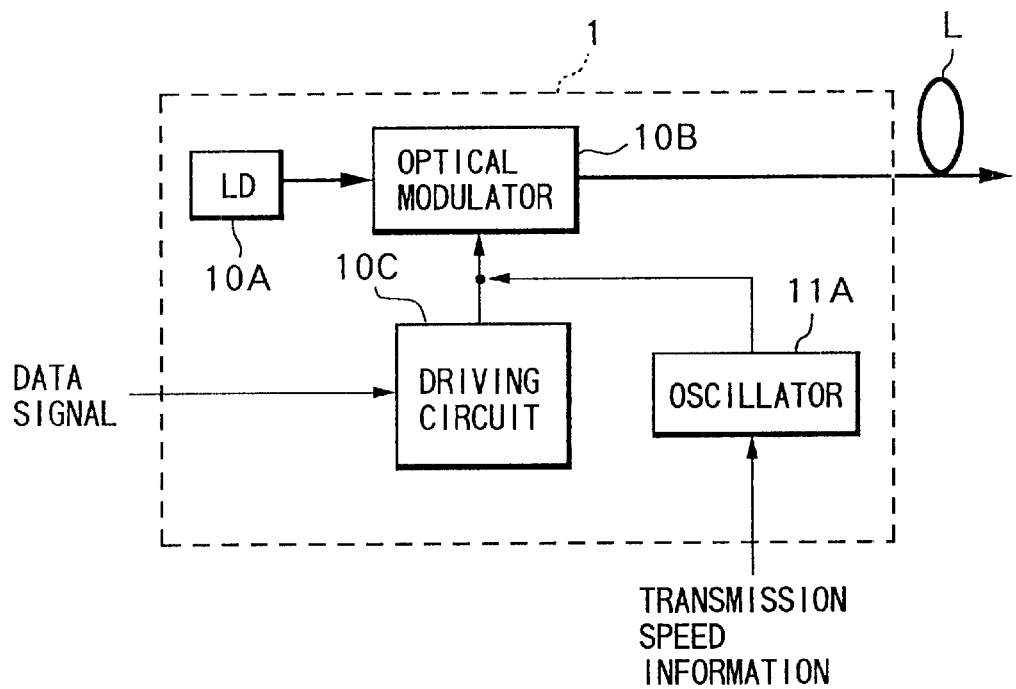
FIG. 2 is a block diagram showing an exemplary constitution of an optical sender of external modulating system in the first embodiment.

FIG. 2 is a block diagram showing an exemplary specific constitution of the optical sender 1.

The exemplary constitution in FIG. 2 shows a case of an external modulating system, and specifically comprises a semiconductor laser (LD) 10A, an optical modulator 10B, a driving circuit 10C and an oscillator 11A. The LD 10A is a typical light emitting element for generating a continuously oscillating laser beam. The optical modulator 10B externally modulates the laser beam emitted from the LD 10A, according to signals output from the driving circuit 10C and oscillator 11A. For example, utilized as the optical modulator 10B is an optical device having a physical characteristic such as refractive index to be changed by an electro-optic effect or acousto-optic effect. The driving circuit 10C generates a modulating signal which is changed in accordance with the data signal, to send the modulating signal to the optical modulator 10B. The oscillator 11A oscillates at a frequency corresponding to the transmission speed of the data signal input to the driving circuit 10C to generate a superimposed signal, and places the superimposed signal onto the modulating signal output from the driving circuit 10C. Here, the transmission speed information about the data signal is given to the oscillator 11A from the exterior. However, the constitution may be such that the optical sender 1 has a function for detecting a transmission speed of a data signal based on the data signal itself, to determine the transmission speed within the optical sender 1.

Note, it is known that, in an existing optical sender using such as an LN modulator utilizing lithium niobate ($LiNbO_3$) as an external modulator, there is performed a loop control in which a superimposed signal is placed onto a modulating signal for driving the LN modulator and an output light from the LN modulator is received by an optical receiver to thereby achieve the stabilization of an operating point of the LN modulator, in order to suppress a fluctuation of the operating point due to drift. In a case of utilizing such an existing optical sender, there is an advantage in that the optical sender 1 of the present invention can be readily realized by simply and additionally providing a function for changing a frequency of the superimposed signal corresponding to each transmission speed.

Figure 3:
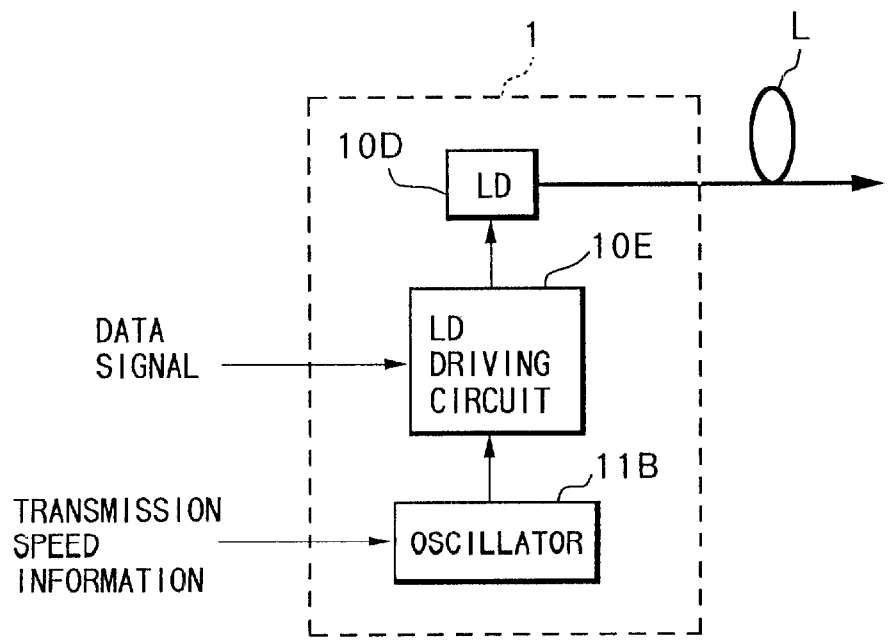
FIG. 3 is a block diagram showing an exemplary constitution of an optical sender of direct modulating system in the first embodiment.

FIG. 3 is a block diagram showing another exemplary specific constitution of the optical sender 1.

The exemplary constitution in FIG. 3 shows a case of a direct modulating system, and specifically comprises an LD 10D, an LD driving circuit 10E and an oscillator 11B. The LD 10D is a typical light emitting element for generating a laser beam by a driving current from the LD driving circuit 10E. The LD driving circuit 10E generates a driving current having an electric current value which is changed in accordance with a data signal and a superimposed signal from the oscillator 11B to supply the driving current to the LD 10D. The oscillator 11B oscillates at a frequency corresponding to the transmission speed of the data signal to generate a superimposed signal, and supplies the superimposed signal to the LD driving circuit 10E. Also in this case, the transmission speed information is given to the oscillator 11B from the exterior. However, the constitution may be such that the optical sender 1 has a function for detecting the transmission speed of the data signal.

There shall be now described specific setting examples, for the optical sender 1 in the aforementioned external modulating system or direct modulating system. Namely, as a transmission speed of a data signal, there can be set bit rates including 9.95328 Gbit/s (hereinafter, 10 Gbit/s), 2.48832 Gbit/s (hereinafter, 2.5 Gbit/s), 622.08 Mbit/s (hereinafter, 622 Mbit/s), and 155.52 Mbit/s (hereinafter, 156 Mbit/s) in conformity to, for example, the SDH (Synchronous Digital Hierarchy). Further, the frequency of the superimposed signal corresponding to the aforementioned transmission speeds may be set at 1 KHz for the transmission speed of 10 Gbit/s, 4 KHz for 2.5 Gbit/s, and 7 KHz for 622 Mbit/s, for example. It is required that the frequency and modulation degree of the superimposed signal are to be in such an extent not to affect the data signal. Specifically, the frequency of the superimposed signal is preferably set at about several KHz and the modulation degree is preferably set at about 1% to 2%, for the aforementioned bit rates. The present invention, however, is not limited to the aforementioned setting examples.

As shown in FIG. 1, the optical receiver 2 includes an optical-electric converting section 20, an equalizing section 21, a decision processing section 22, a speed detecting section 23 as speed detecting means, and a clock extracting section 24. The optical-electric converting section 20 receives the optical signal propagated through optical transmission path L from the optical sender 1, to generate an electrical signal corresponding to the power of the optical signal. To be specific, for example, the optical-electric or optic-electric converting section 20 comprises a light receiving element such as a PIN photodiode or an avalanche photodiode and a converting circuit for converting an electric current generated at the light receiving element into a voltage signal. Further, in a case where the electrical signal based on the received optical signal does not reach a level sufficient for the processing at the latter stage, a preamplifier and the like may be provided appropriately. The equalizing section 21 is a typical electric amplifier for linearly amplifying an output signal from the optic-electric converting section 20, and, here, has a sufficiently wide equalizing band corresponding to each transmission speed of the optical signal to be received. The decision processing section 22 performs a data decision processing for the received signal output from the equalizing section 21, by utilizing a clock signal from the clock extracting section 24. The decision result is output from the optical receiver 2 such as to the exterior, as a data signal.

The speed detecting section 23 utilizes the output signal from the optic-electric converting section 20 to thereby detect the transmission speed of the received optical signal, based on the superimposed signal included in such an output signal, and outputs a signal corresponding to the detection result to the clock extracting section 24. The clock extracting section 24 utilizes the output signal from the optic-electric converting section 20 to thereby extract a clock signal corresponding to the received optical signal in accordance with the signal output from the speed detecting section 23, to output the clock signal to the decision processing section 22, the exterior of the optical receiver 2 and the like.

Figure 4:
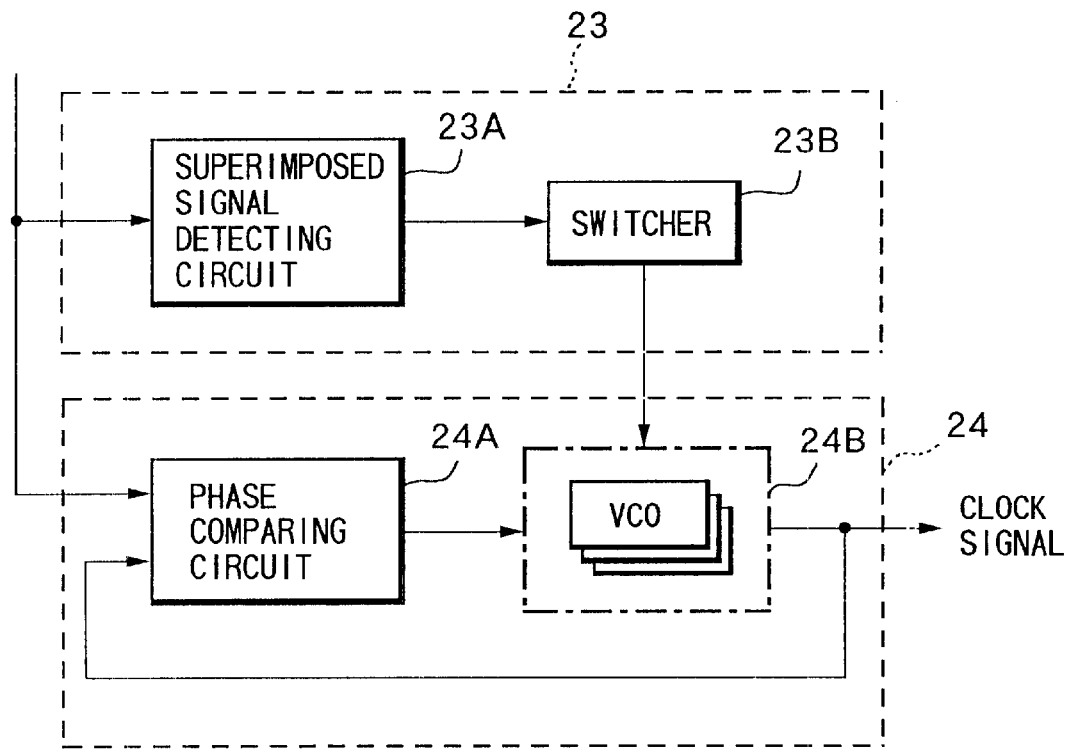
FIG. 4 is a block diagram showing an exemplary constitution of a speed detecting section and a clock extracting section in the first embodiment.

Here, there will be specifically described hereinafter the speed detecting section 23 and clock extracting section 24. FIG. 4 is a block diagram showing an exemplary constitution of the speed detecting section 23 and clock extracting section 24.

As shown at the upper half of FIG. 4, the speed detecting section 23 is constituted of a superimposed signal detecting circuit 23A and a switcher 23B. The superimposed signal detecting circuit 23A extracts the superimposed signal included in the output signal from the optic-electric converting section 20, to output, to the switcher 23B, a signal corresponding to the transmission speed of the received light, based on the frequency of the superimposed signal. In accordance with the signal from the superimposed signal detecting circuit 23A, the switcher 23B generates a controlling signal for switching the operation setting of the clock extracting section 24.

Figure 5:
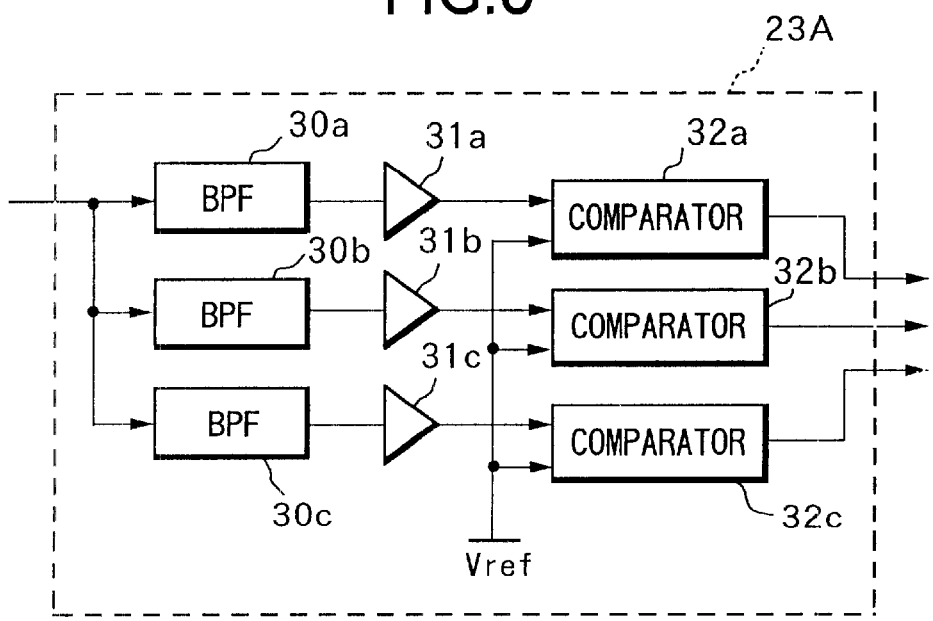
FIG. 5 is a circuit diagram showing a preferable exemplary constitution of a superimposed signal detecting circuit in the first embodiment.

FIG. 5 is a circuit diagram showing a preferable exemplary constitution for realizing the function of the aforementioned superimposed signal detecting circuit 23A. Here, there is shown a circuit structure assuming three kinds of transmission speeds Va, Vb, Vc, as the transmission speed of the received light.

The superimposed signal detecting circuit 23A in FIG. 5 is provided with band-pass filters (BPS's) 30a, 30b, 30c, amplifiers 31a, 31b, 31c and comparators 32a, 32b, 32c, respectively, corresponding to the transmission speeds Va, Vb, Vc. Each of the BPF's 30a, 30b, 30c is input with the signal output from the optic-electric converting section 20, and is set so that the center frequency of each passing band substantially coincides with the frequency of the superimposed signal corresponding to each of transmission speeds Va, Vb, Vc. The amplifiers 31a, 31b, 31c amplify, at a constant rate, the output signals from the BPF's 30a, 30b, 30c connected to the input terminals of amplifiers 31a, 31b, 31c, respectively, to output the amplified signals to one of the input terminals of each of the comparators 32a, 32b, 32c connected to the output terminals of the amplifiers 31a, 31b, 31c, respectively. Each of the comparators 32a, 32b, 32c has the other input terminal supplied with a preset reference voltage Vref, to compare the voltage level of the output signal from the associated one of amplifiers 31a, 31b, 31c with the reference voltage Vref. For example, each comparator generates a high level output when the level of the output signal from the associated amplifier is equal to or higher than the reference voltage Vref, and a low level output when less than the reference voltage Vref. Note, the reference voltage Vref may be set near an intermediate value between the output voltage level of the associated one of the amplifiers 31a, 31b, 31c, which corresponds to the transmission speed of the optical signal, in the presence of the optical signal, and the output voltage level (i.e., noise level) of the associated one of the amplifiers in the absence of received optical signal. The signals output from the comparators 32a, 32b, 32c are sent to the switcher 23B, respectively.

As shown at the lower half of FIG. 4, the clock extracting section 24 includes a circuit structure of a so-called phase-lock loop (PLL), and is specifically constituted of a phase comparing circuit 24A and a VCO circuit 24B. The phase comparing circuit 24A has one input terminal input with the output signal from the optic-electric converting section 20, and the other input terminal input with an output signal from the VCO circuit 24B, to output an error signal proportional to a phase difference between the respective input signals, to the VCO circuit 24B. Note, the phase comparing circuit 24A may be provided with a loop filter not shown in the figure, for extracting a required signal component from the error signal. The VCO circuit 24B includes, for example, three voltage controlled oscillators (VCO's) corresponding to the transmission speeds Va, Vb, Vc, respectively. Each VCO is input with the error signal from the phase comparing circuit 24A and the controlling signal from the speed detecting section 23. Each VCO is a typical voltage controlled oscillator, which generates an oscillation output at an intrinsic oscillation frequency at a time of initial operation, and when the error signal from the phase comparing circuit 24A is input, the frequency of the oscillation output is changed in response to the error signal. In accordance with the controlling signal from the speed detecting section 23, any one of these three VCO's, which corresponds to the transmission speed of the received optical signal, is selectively driven. Further, the oscillation output generated in the thus selected VCO is output, as a clock signal, to the decision processing section 22, the exterior of the optical receiver 2 and the like.

Note, if each of the comparators 32a, 32b, 32c of the superimposed signal detecting circuit 23A is capable of generating two kinds of output voltages corresponding to a power source voltage and a GND level of each VCO, respectively, it is possible to directly apply the outputs of the comparators 32a, 32b, 32c to the corresponding VCO's, respectively, without going through the switcher 23B, to select the desired one of the VCO's by switching ON and OFF the VCO's.

There will be described hereinafter an operation of the optical communication system having the above constitution.

In the present optical communication system, when the data signal and the transmission speed information about the data signal are input to the optical sender 1, the optical sender 1 outputs an optical signal, which is modulated in accordance with the data signal and includes a superimposed signal component having a frequency corresponding to the input transmission speed of the data signal, to the optical transmission path L. This optical signal is propagated through the optical transmission path L to be sent to the optical receiver 2.

In the optical receiver 2, the optical signal propagated through the optical transmission path L is input to the optic-electric converting section 20. The optic-electric converting section 20 sends an electrical signal corresponding to the power of the received light, to the equalizing section 21, speed detecting section 23 and clock extracting section 24. At the equalizing section 21, the electrical signal from the optic-electric converting section 20 is equalized and amplified up to a required level, and then output to the decision processing section 22.

At the speed detecting section 23, the signal from the optic-electric converting section 20 is sent to the superimposed signal detecting circuit 23A so that a superimposed signal component included in this signal is extracted by any one of the BPF's 30a, 30b, 30c, at the same time of the above equalization/amplification processing. For example, if the superimposed signal component is extracted by the BPF 30a, the superimposed signal is input to the comparator 32a via the amplifier 31a so that the output signal of the comparator 32a becomes a high level. At this time, the level of the input signal in each of the remaining comparators 32b, 32c is on the order of the noise level of each of the associated amplifiers 31b, 31c, so that the output signal of each of the comparators 32b, 32c becomes a low level. At the switcher 23B which received the high level output signal from the comparator 32a, the transmission speed of the received light is judged based on the correspondence relationship between the comparators 32a, 32b, 32c and the transmission speeds, and a controlling signal for selecting the VCO corresponding to the thus judged transmission speed is output to the VCO circuit 24B of the clock extracting section 24.

At the clock extracting section 24, the VCO corresponding to the transmission speed of the received light is selectively driven in accordance with the controlling signal from the switcher 23B, and a part of the oscillation output of the driven VCO is input to the phase comparing circuit 24A. This phase comparing circuit 24A is input with the output signal of the optic-electric converting section 20, so as to generate an error signal indicative of the phase difference between the clock signal from the VCO circuit 24B and the output signal of the optic-electric converting section 20. This error signal is sent to the VCO circuit 24B so as to successively control the oscillation frequency of the selected VCO such that the phase difference is reduced. Thus, the oscillation output of the selected VCO is brought into a certain frequency, so that a clock signal synchronized with the transmission speed of the received light is generated to be output to the decision processing section 22, the exterior of the optical receiver 2 and the like.

At the decision processing section 22, a data decision processing of the received signal output from the equalizing section 21 is executed making use of the clock signal from the clock extracting section 24, and the decision result as the data signal is output from the optical receiver 2 to the exterior and the like.

According to the aforementioned optical communication system of this embodiment, the optical sender 1 places the superimposed signal corresponding to the transmission speed of the data signal onto the transmission light. And the optical receiver 2 detects the transmission speed of the data signal based on the superimposed signal included in the received light and switches the VCO's of the clock extracting section 24 corresponding to the detection result, to thereby extract a clock signal. Thus, it becomes possible to receive and process optical signals at different transmission speeds by a single optical receiver, thereby enabling to provide an optical communication system with a simplified constitution capable of coping with a plurality of transmission speeds. This also provides such an effect that the number of types of optical receivers to be used in optical communication systems can be reduced.

There will be described hereinafter a second embodiment of the optical communication system according to the present invention.

Here, there will be considered a modified example of the clock extracting section in the optical receiver 2 used in the first embodiment. Note, the second embodiment uses the same basic constitution of the whole optical communication system, and the same constitution and operation of the optical sender, as the first embodiment (see FIGS. 1 through 3).

Figure 6:
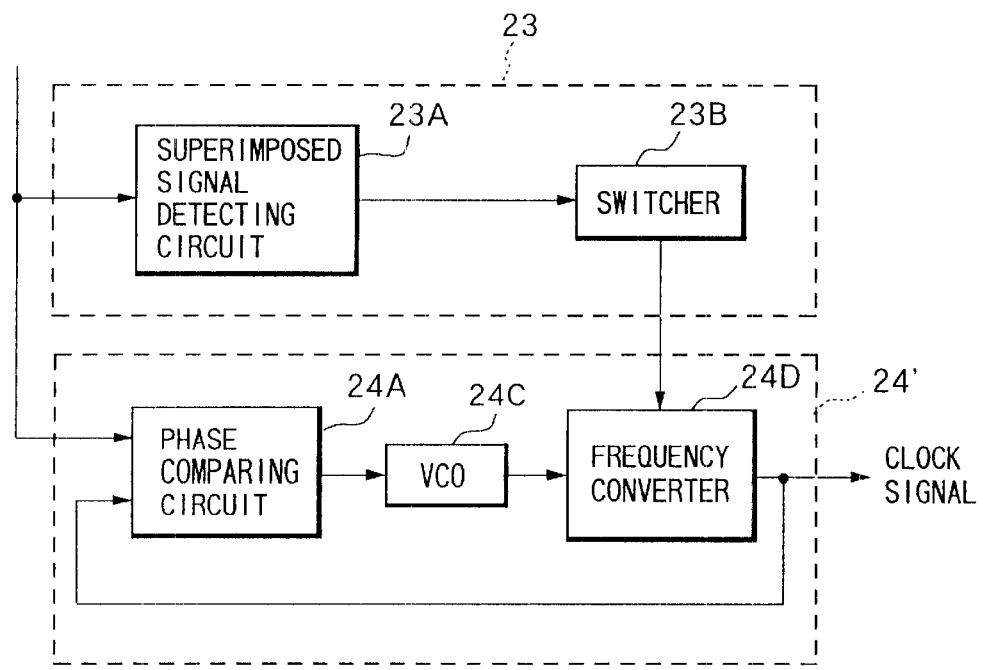
FIG. 6 is a block diagram showing an exemplary constitution of a speed detecting section and a clock extracting section to be utilized in a second embodiment of the optical communication system according to the present invention.

FIG. 6 is a block diagram showing an exemplary constitution of a speed detecting section and a clock extracting section of an optical receiver in the second embodiment. Those parts identical with the constitution of the first embodiment are designated by the identical numerals, and the same rule applies corresponding to the following.

Instead of the clock extracting section 24 shown in FIG. 4, the optical receiver 2 used in this embodiment shown in FIG. 6 is provided with a clock extracting section 24' comprising a phase comparing circuit 24A, a voltage controlled oscillator (VCO) 24C and a frequency converter 24D. The constitution of the optical receiver 2 other than the clock extracting section 24' is the same as the first embodiment (see FIGS. 1 and 5).

The phase comparing circuit 24A is the same as what has been used in the clock extracting section 24. The single VCO 24C is a typical voltage controlled oscillator, which is input with an error signal from the phase comparing circuit 24A and generates an oscillation output at an intrinsic oscillation frequency at a time of initial operation, so that the frequency of the oscillation output is changed in accordance with the input error signal. The frequency converter 24D is a known one for multiplying or dividing the frequency of an oscillation signal output from the VCO 24C, to output the resultant signal. A conversion ratio (multiplication ratio or division ratio) of the frequency converter 24D is controllable in response to the controlling signal sent from the speed detecting section 23. An output signal from the frequency converter 24D is input to the phase comparing circuit 24A and also sent, as a clock signal, to the decision processing section 22 and the like.

In the optical receiver 2 having the clock extracting section 24' of the aforementioned constitution, when the optical signal propagated through the optical transmission path L is input to the optic-electric converting section 20 as in the same manner as in the first embodiment, an electrical signal corresponding to the power of the received light is sent to the equalizing section 21, speed detecting section 23 and clock extracting section 24'. Further, at the same time of the equalization/amplification processing at the equalizing section 21, a detection processing of the transmission speed is executed based on the superimposed signal at the speed detecting section 23. Moreover, at the speed detecting section 23, there is generated by the switcher 23B a controlling signal for adjusting the conversion ratio of the frequency converter 24D of the clock extracting section 24' in accordance with the detected transmission speed, and this controlling signal is transmitted to the frequency converter 24D.

At the clock extracting section 24', the conversion ratio of the frequency converter 24D is set at a value corresponding to the transmission speed of the received light in accordance with the controlling signal from the speed detecting section 23, and the phase comparing circuit 24A is input with the output signal from the optic-electric converting section 20. Thus, there is formed a PLL circuit corresponding to the transmission speed of the received light such that the output signal of the frequency converter 24D as a clock signal is sent to the decision processing section 22 and the like, so as to execute the data decision processing of the received signal.

As described above, according to the second embodiment, it is possible to receive and process optical signals at different transmission speeds by a single optical receiver, even by unifying the VCO's of the clock extracting section to provide the frequency converter 24D, so that the conversion ratio of the frequency converter 240 is adjusted according to the transmission speed of the received light, to extract a clock signal, thereby resulting in the same effect as in the first embodiment.

There will be described hereinafter a third embodiment of the optical communication system according to the present invention.

Figure 7:
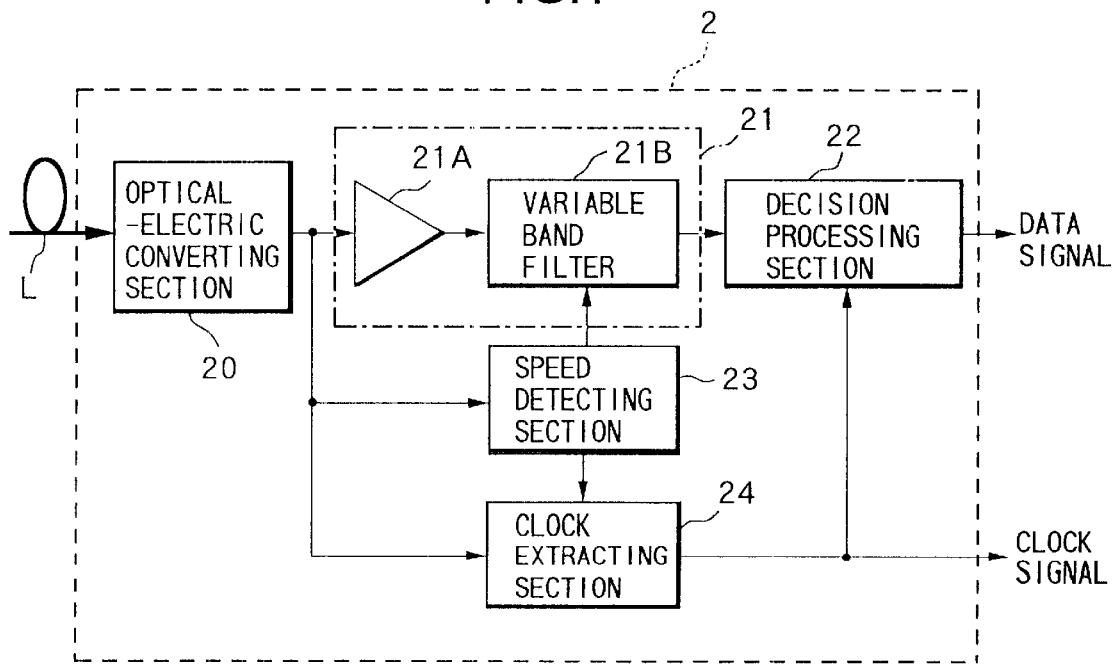
FIG. 7 is a block diagram showing a basic constitution of an optical receiver to be utilized in a third embodiment of the optical communication system according to the present invention.

FIG. 7 is a block diagram showing a basic constitution of an optical receiver to be utilized in the third embodiment. Note, the basic constitution of the optical sender is the same as in the first embodiment shown in FIG. 1.

In FIG. 7, the optical receiver 2 to be utilized in the present optical communication system is constituted such that the equalizing band of the equalizing section 21 is variably controlled according to the transmission speed of the received light detected at the speed detecting section 23, and more specifically, such that the equalizing section 21 includes an amplifier 21A and a variable band filter 21B so that the passing band (cutoff characteristic) of the variable band filter 21B is controlled in response to the controlling signal from the speed detecting section 23.

The amplifier 21A linearly amplifies the output signal from the optic-electric converting section 20 up to a required level, to output the amplified signal. As the variable band filter 21B, it is possible to use such a circuit in which a filter circuit constituted of a resistor, a capacitor and the like, is disposed with such as a varactor diode with the capacitance value being changed according to an applied voltage thereto, such that the varactor diode is arranged in parallel to the capacitor, to thereby make the passing band variable by controlling the applied voltage. Although the constitution here has used the varactor diode, for example, it is additionally possible to arrange a plurality of passive filters having passing bands different from one another, and to select one of the passive filters according to the transmission speed.

The optical receiver 2 having the aforementioned constitution is controlled such that, when the transmission speed of the received light is detected based on the superimposed signal at the speed detecting section 23 as in the same manner as in the first embodiment, the operation setting of the clock extracting section is switched according to the detected transmission speed and also the band of the variable band filter 21B is adjusted, so that the equalizing band becomes suitable for receiving and processing the input signal. Specifically, it is desirable to control the band of the variable band filter 21B such that the equalizing band of the equalizing section 21 becomes about 60% to 70% of the transmission speed of the received light. In this way, the received signal, which has been equalized and amplified in the rather optimum band, is sent to the decision processing section 22, and the decision processing section 22 executes the data decision processing making use of the clock signal extracted by the clock extracting section 24 corresponding to the transmission speed, to output the decision result as the data signal.

According to the third embodiment, the equalizing band of the equalizing section 21 is also controlled according to the transmission speed of the received light, which is detected at the speed detecting section 23. Thus it becomes possible to precisely receive and process optical signals at different transmission speeds, respectively.

In the third embodiment, there has been described a case where the band control of the equalizing section 21 is performed in the first embodiment. However, this can be also applied to the second embodiment, in the same manner.

There will be described hereinafter an embodiment of a wavelength converter according to the present invention.

Figure 8:
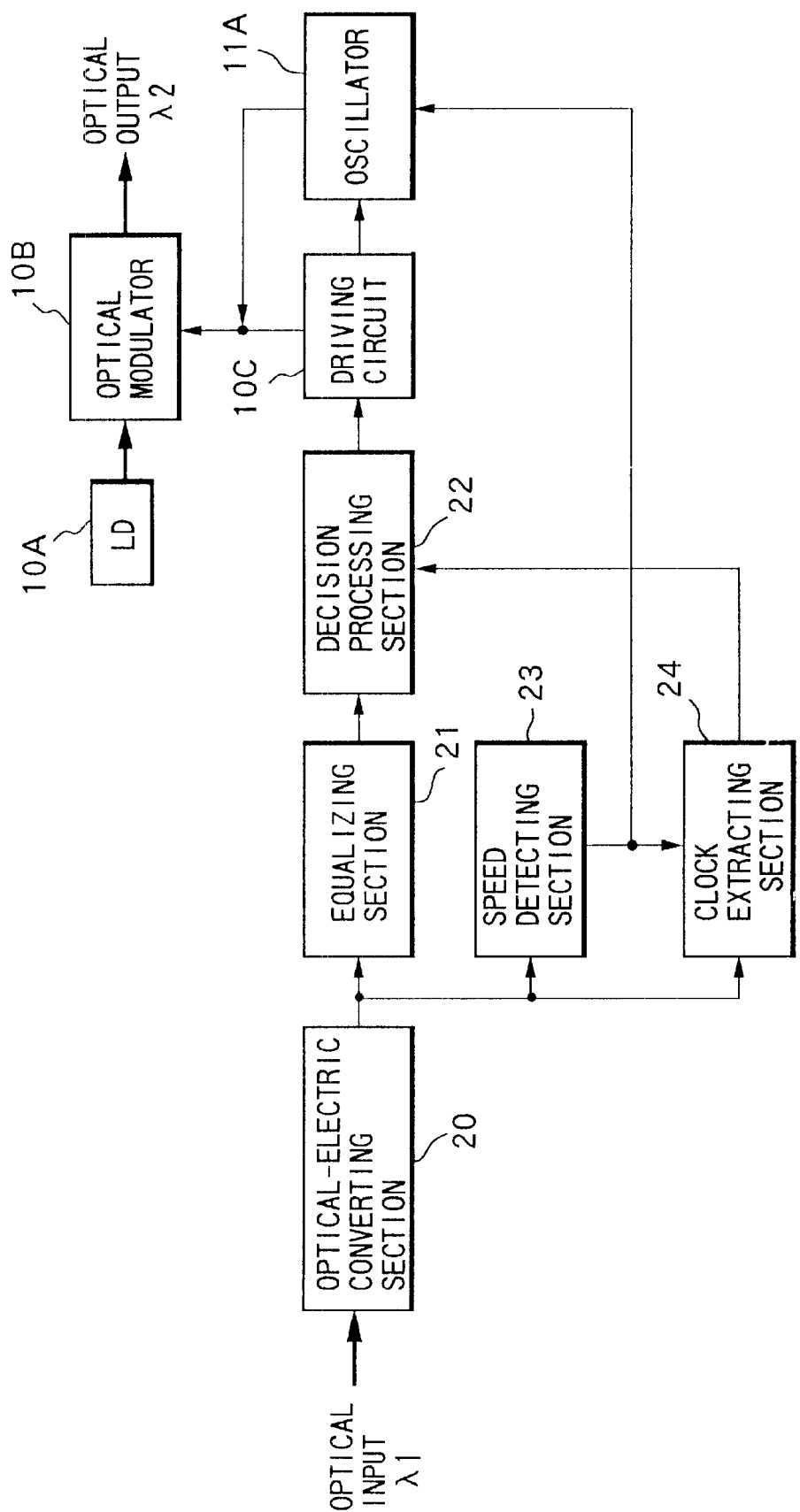
FIG. 8 is a block diagram showing a constitution of an embodiment of a wavelength converter according to the present invention.

FIG. 8 is a block diagram showing a constitution of the wavelength converter according to the present invention.

In FIG. 8, the present wavelength converter is constituted, for example, by arranging the optical sender 1 of external modulating type (see FIG. 2) into an output stage of the optical receiver 2 (see FIG. 1) used in the abovementioned first embodiment. Specifically, the data signal decided by the decision processing section 22 is sent to the driving circuit 10C. The driving circuit 10C generates a driving signal modulated in accordance with the data signal, and at the same time, the controlling signal output from the speed detecting section 23 is sent to the oscillator 11A, to generate the superimposed signal at the frequency corresponding to the transmission speed in response to the controlling signal. Here, differently from the wavelength $\lambda 1$ of the optical signal to be input to this wavelength converter, the wavelength of an optical output of the LD 10A is set at $\lambda 2$ ($\lambda 1$), to perform the wavelength conversion from the wavelength $\lambda 1$ to $\lambda 2$ in this wavelength converter.

In this wavelength converter as described above, the speed detecting section 23 corresponds to the speed detecting means, the optic-electric converting section 20, equalizing section 21, decision processing section 22 and clock extracting section 24 correspond to data processing means, the LD 10A, optical modulator 10B and driving circuit 10C correspond to output light generating means, and the oscillator 11A corresponds to the superimposed signal generating means.

In the wavelength converter having the aforementioned constitution, when the optic-electric converting section 20 is input with an optical signal of the wavelength $\lambda 1$ placed with the superimposed signal corresponding to the transmission speed, the electrical signal corresponding to the power of input light is sent to the equalizing section 21, speed detecting section 23 and clock extracting section 24. Then, at the same time of the equalization/amplification processing at the equalizing section 21, the detection processing of the transmission speed is executed based on the superimposed signal at the speed detecting section 23, so that the controlling signal corresponding to the detected transmission speed is sent to the clock extracting section 24 and oscillator 11A. At the clock extracting section 24, the VCO corresponding to the transmission speed of the input light is selected in accordance with the controlling signal from the speed detecting section 23, to send the extracted clock signal to the decision processing section 22. At the decision processing section 22, the data decision processing of the input signal is performed making use of the clock signal from the clock extracting section 24, and the decision result is sent to the driving circuit 10C as the data signal. At the driving circuit 10C, the driving signal modulated in accordance with the data signal from the decision processing section 22 is generated, to be output to the optical modulator 10B. This driving signal is placed with the superimposed signal output from the oscillator 11A, and the oscillation frequency of the oscillator 11A is controlled to a value corresponding to the transmission speed of the input light, in accordance with the controlling signal from the speed detecting section 23. The optical modulator 10B is driven in accordance with the driving signal placed with such a superimposed signal, so that the continuous light of the wavelength $\lambda 2$ emitted from the LD 10A is externally modulated, and then output as an optical output after wavelength conversion to the exterior of the present wavelength converter.

According to this embodiment, a wavelength converter having a simplified constitution capable of coping with input lights at different transmission speeds can be provided. Thus, it becomes possible to realize a wavelength converter independent of a transmission speed of an input light. Particularly, it is useful that such a wavelength converter is applied to an optical communication system adopting such as an optical ADM (Add and Drop Multiplexer) system.

In the above embodiment, there has been described a case where the optical sender of external modulating type is applied. It is of course possible to apply the optical sender of the direct modulating type as shown in FIG. 3. Further, it is possible to apply the clock extracting section 24' used in the second embodiment, and also to adopt such a constitution that the equalizing band of the equalizing section 21 is controlled according to the detection result at the speed detecting section 23, similarly to the third embodiment.

The present invention has a greater industrial applicability, to various optical communication systems for transmitting optical signals at different transmission speeds, to optical receivers and wavelength converters to be used in such systems, and particularly to those optical communication systems adopting such as a wavelength-division multiplexing transmission system and/or optical ADM system.

What is claimed is:

1. An optical communication system including an optical sender that transmits optical signals at different transmission speeds and an optical receiver that receives a transmission light from said optical sender to thereby perform a data decision processing,
    wherein said optical sender comprises superimposed signal generating means for generating a superimposed signal corresponding to a transmission speed of transmission light, to place said superimposed signal onto said transmission light, and
    said optical receiver comprises speed detecting means for detecting the transmission speed based on said superimposed signal included in a received light, and data processing means for performing a data decision processing of said received light according to the transmission speed detected by said speed detecting means.

2. An optical communication system according to claim 1, wherein said data processing means comprises:
    an optic-electric converting section that receives a transmission light from said optical sender to convert the received light into an electrical signal;
    an equalizing section that linearly amplifies an output signal from said optic-electric converting section;
    a clock extracting section that extracts a clock signal based on the output signal from said optic-electric converting section, making use of a phase-lock loop circuit with an operation setting thereof being switched corresponding to the transmission speed detected by said speed detecting means; and
    a decision processing section that performs a data decision processing of an output signal from said equalizing section, making use of the clock signal extracted by said clock extracting section.

3. An optical communication system according to claim 2, wherein said phase-lock loop circuit of the clock extracting section includes a plurality of controlled type oscillators corresponding to a plurality of transmission speeds, respectively, and any one of said plurality of controlled type oscillators is driven according to the transmission speed detected by said speed detecting means.

4. An optical communication system according to claim 2, wherein said phase-lock loop circuit of said clock extracting section includes a single controlled type oscillator and a frequency converter that converts the frequency of an oscillation signal to be output from said controlled type oscillator, and a conversion ratio of said frequency converter is set according to the transmission speed detected by said speed detecting means.

5. An optical communication system according to claim 2, wherein said equalizing section has a variable equalizing band, which is controlled according to the transmission speed detected by said speed detecting means.

6. An optical receiver that receives optical signals at different transmission speeds to perform a data decision processing,
    wherein said optical receiver comprises;
        speed detecting means for detecting a transmission speed of a received light, based on a superimposed signal which corresponds to the transmission speed and is included in said received light; and
        data processing means for performing a data decision processing of said received light, according to the transmission speed detected by said speed detecting means.

7. An optical receiver according to claim 6, wherein said data processing means comprises:
    an optic-electric converting section that receives a transmission light and converts the received light into an electrical signal;
    an equalizing section that linearly amplifies an output signal from said optic-electric converting section;
    a clock extracting section that extracts a clock signal based on the output signal from said optic-electric converting section, making use of a phase-lock loop circuit with an operation setting thereof being switched corresponding to the transmission speed detected by said speed detecting means; and
    a decision processing section that performs a data decision processing of an output signal from said equalizing section, making use of the clock signal extracted by said clock extracting section.

8. An optical receiver according to claim 7,
    wherein said phase-lock loop circuit of the clock extracting section includes a plurality of controlled type oscillators corresponding to a plurality of transmission speeds, respectively, and any one of said plurality of controlled type oscillators is driven according to the transmission speed detected by said speed detecting means.

9. An optical receiver according to claim 7, wherein said phase-lock loop circuit of said clock extracting section includes a single controlled type oscillator and a frequency converter that converts the frequency of an oscillation signal to be output from said controlled type oscillator, and a conversion ratio of said frequency converter is set according to the transmission speed detected by said speed detecting means.

10. An optical receiver according to claim 7,
    wherein said equalizing section has a variable equalizing band, which is controlled according to the transmission speed detected by said speed detecting means.

11. A wavelength converter that converts an optical signal input thereto, into an optical signal at the frequency different from the frequency of the input optical signal,
    wherein said wavelength converter comprises:
        speed detecting means for detecting a transmission speed of input light, based on a superimposed signal which corresponds to the transmission speed and is included in said input light;
        data processing means for performing a data decision processing of said input light, according to the transmission speed detected by said speed detecting means;
        output light generating means for generating an output light having a wavelength different from the wavelength of said input light and modulated in accordance with a data signal indicative of a processing result by said data processing means; and superimposed signal generating means for generating a superimposed signal corresponding to the transmission speed detected by said speed detecting means, to place said superimposed signal onto said output light.

12. An optical communication method for transmitting optical signals at different transmission speeds and receiving a transmission light, comprising:

generating a superimposed signal corresponding to a transmission speed of a transmission light, to place the superimposed signal on the transmission light;

detecting the transmission speed based on the superimposed signal included in a received light; and performing a data decision processing of the received light, according to the detected transmission speed.

13. An optical receiving method for receiving optical signals at different transmission speeds to perform a data decision processing, comprising:

detecting a transmission speed of a received light, based on a superimposed signal which corresponds to the transmission speed and which is included in the received light; and performing a data decision processing of the received light, according to the detected transmission speed.

14. A method for converting an input optical signal into an optical signal at a frequency different from the frequency of the input optical signal, comprising:

detecting a transmission speed of input light based on a superimposed signal which corresponds to the transmission speed and which is included in the input light;

performing a data decision processing of the input light, based on the detected transmission speed;

generating an output light having a wavelength different from the wavelength of the input light and modulated in accordance with a data signal corresponding to the data decision processing; and generating an output superimposed signal corresponding to the detected transmission speed to place the output superimposed signal on the output light.

* * * * *